US006861912B1

United States Patent
Culler et al.

(10) Patent No.: US 6,861,912 B1
(45) Date of Patent: Mar. 1, 2005

(54) OSCILLATOR METHOD AND APPARATUS FOR A TEST CHIP

(75) Inventors: Jason H. Culler, Livermore, CO (US); Peter Shaw Moldauer, Wellington, CO (US)

(73) Assignee: Hewlett-Packard Development Company, L.P., Houston, TX (US)

(*) Notice: Subject to any disclaimer, the term of this patent is extended or adjusted under 35 U.S.C. 154(b) by 71 days.

(21) Appl. No.: 10/619,909

(22) Filed: Jul. 14, 2003

(51) Int. Cl.[7] .............................................. H03B 27/00
(52) U.S. Cl. ........................................ 331/57; 331/44
(58) Field of Search .............................. 331/57, 44, 74

(56) References Cited

U.S. PATENT DOCUMENTS 4,495,628 A * 1/1985 Zasio .......................... 377/70
5,818,250 A * 10/1998 Yeung et al. ................ 324/763
6,544,807 B1 * 4/2003 Bach ............................ 438/18

* cited by examiner

Primary Examiner—Robert Pascal
Assistant Examiner—Joseph Chang

(57) ABSTRACT

A method and apparatus for modifying a frequency of an oscillating signal comprises generating an oscillating signal of a predetermined frequency on a semiconductor device used as an evaluation test chip by connecting a predetermine number of circuit elements in a ring oscillator configuration. A delay element operably coupled into the ring oscillator configuration modifies the predetermined frequency of the ring oscillator configuration. The operable coupling may occur on a semiconductor package containing the semiconductor device or a circuit board containing the semiconductor device. A ring oscillator is also described.

20 Claims, 3 Drawing Sheets

US 6,861,912 B1

OSCILLATOR METHOD AND APPARATUS FOR A TEST CHIP

BACKGROUND

Oscillators are well known in the art and important in providing clock signals in digital logic circuits. Clock generation for semiconductor devices can take many forms including ring oscillators, crystal controlled oscillators, external clock devices, Phase Locked Loops (PLL) on a semiconductor device, Delay Locked Loops (DLL) on a semiconductor device, and various combinations of the above. Crystal controlled oscillators are generally useful for precisely creating a desired frequency, but cannot directly produce the very high frequencies required in a test chip designed to evaluate high performance circuitry. Similarly, external clock generators vary greatly in precision and frequency, but they are generally designed to maintain a precise fixed frequency and create global clocks for distribution within a system. As a result, external clock generators tend to be expensive.

Generally high frequency clocks on a system board are generated by expensive clock generators and maintaining a clean clock signal at high frequencies is problematic. To overcome this problem, many semiconductor devices use PLL's, which create internal clocks at higher frequencies, generally multiples of a lower frequency external reference clock. To be accurate, yet flexible enough to generate a large variety of frequencies, PLL's can be difficult to design. PLL's generally require analog circuit design techniques, and may still not provide the flexibility required for a test chip where varying the frequency of the clock is valuable in analyzing various performance parameters of a test chip.

DLL's may also be used to create clock multiples for an internal clock signal from a lower frequency clock reference. Some DLL's do not require analog circuitry but generally have the same problems of design complexity and lack of flexibility as a PLL solution when used for a test chip. However, DLLs are also often used to create phase shifts in an internal clock on a semiconductor device relative to a reference clock. When used as a phase-shifting device, DLL's may be quite useful in a test chip.

For a test chip, there is a need for a low cost high frequency oscillator solution that is flexible both in creating a desired frequency and in the ability to easily modify the created frequency.

SUMMARY

One embodiment of the present invention for generating a signal with a ring oscillator may comprise a semiconductor device used as an evaluation test chip physically attached to a semiconductor device package. The semiconductor device comprises at least an input pad circuit, a buffering circuit, and an output pad circuit. These elements on the semiconductor device form a serial chain by connecting an output signal of the input pad to an input signal of the buffering circuit and connecting an output signal of the buffering circuit to an input signal of the output pad. A delay circuit completes the ring oscillator by connecting an output terminal on the output pad to an input terminal on the delay element and connecting an output pad of the delay circuit to an input signal on the input pad. The frequency of the ring oscillator is modified due to the delay circuit altering the signal arrival time at the input signal of the input pad. To ensure oscillation, the completed ring comprises an odd number of logic inversions.

Another embodiment may comprise a semiconductor device used as an evaluation test chip physically attached to a semiconductor device package and the semiconductor package is physically attached to a circuit board. Once again, the semiconductor device comprises at least an input pad circuit, a buffering circuit, and an output pad circuit. These elements on the semiconductor device form a serial chain by connecting an output signal of the input pad to an input signal of the buffering circuit and connecting an output signal of the buffering circuit to an input signal of the output pad. A delay circuit completes the ring oscillator by connecting an output terminal on the output pad to an input terminal on the delay element and connecting an output pad of the delay circuit to an input signal on the input pad. The frequency of the ring oscillator is modified due to the delay circuit altering the signal arrival time at the input signal of the input pad. To ensure oscillation, the completed ring comprises an odd number of logic inversions.

In another embodiment, a method for modifying a frequency of an oscillating signal may comprise generating an oscillating signal of a predetermined frequency on a semiconductor device used as an evaluation test chip by connecting a predetermine number of circuit elements in a ring oscillator configuration. A delay element operably coupled into the ring oscillator configuration modifies the predetermined frequency of the ring oscillator. The operable coupling, in this embodiment, occurs on a semiconductor device package containing the semiconductor device.

In yet another embodiment, a method for modifying a frequency of an oscillating signal may comprise generating an oscillating signal of a predetermined frequency on a semiconductor device used as an evaluation test chip by connecting a predetermine number of circuit elements in a ring oscillator configuration. A delay element operably coupled into the ring oscillator configuration modifies the predetermined frequency of the ring oscillator configuration. In this embodiment, the operable coupling occurs on a circuit board containing the semiconductor device.

BRIEF DESCRIPTION OF THE SEVERAL VIEWS OF THE DRAWINGS

In the drawings, which illustrate what is currently considered to be the best mode for carrying out the invention.

DETAILED DESCRIPTION OF THE INVENTION

Figure 1:
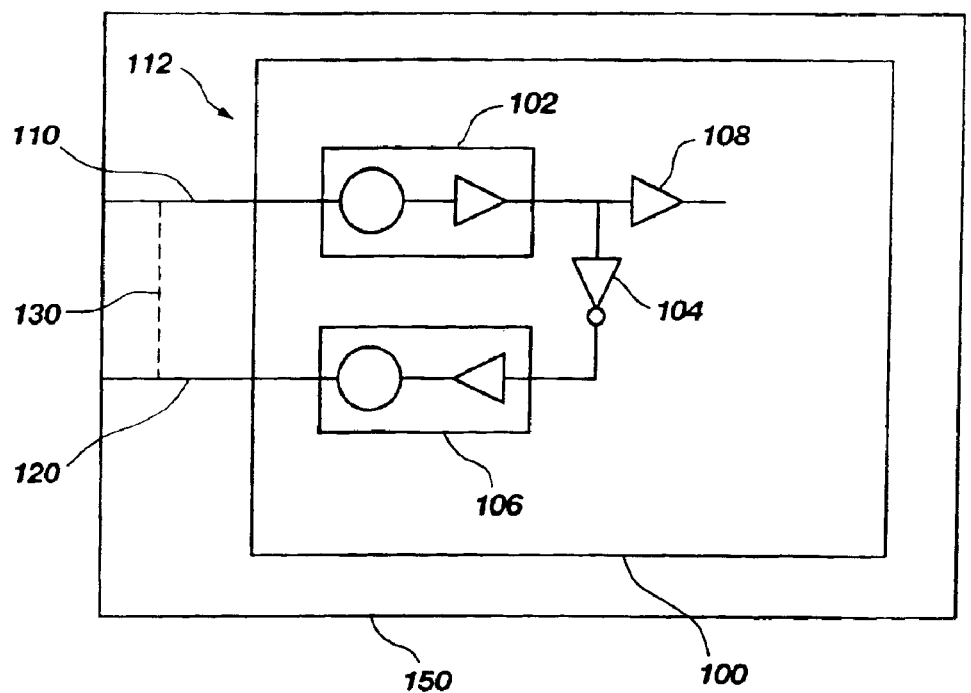
FIG. 1 is a block diagram showing a semiconductor device with input/output pads mounted on a package.

FIG. 1 is a diagram illustrating an evaluation test chip, also referred to as a semiconductor device 100. The semiconductor device 100 is physically mounted on a semiconductor device package 150. An input pad 102 connects to a buffer 108, which in turn drives a clock tree or other circuitry (not shown) within the semiconductor device 100. The input pad 102 also drives an inverting circuit 104, which in turn drives a typical output pad 106. The circuitry configuration of input pad 102, inverting circuit 104, and output pad 106 comprise portions of a ring oscillator circuit 112 implemented on the semiconductor device 100. While shown as a logical inverter, the inverting circuit 104 may be comprised of other logic gates, such as, for example, NAND gates and NOR gates (not shown). These types of gates are typically used to enable and disable a ring oscillator circuit. Even more complex logic implementations are possible in which, as in this implementation, a final ring implementation results in an odd number of logic inversions in a chain of inversions when the chain is in an oscillating mode.

A number of different optional configurations are also contemplated as within the scope of the present invention to close the ring configuration creating ring oscillator circuit 112. FIG. 1 illustrates an embodiment of the present invention. In this embodiment, input pad 102 and output pad 104 connect to a substrate of the semiconductor device package 150 using any bonding technology known by those of ordinary skill in the art, such as, for example; wire bonding, solder balls, and tape automated bonding. An input connection point 110 connects to input pad 102 and an output connection point 120 connects to the output pad 106. To close ring oscillator circuit 112, input connection point 110 connects to output connection point 120 by circuit trace 130 on the semiconductor device package 150. The frequency at which the ring oscillator circuit 112 oscillates may be tuned within a certain range by varying the length and width of the circuit trace 130, thereby varying the characteristic impedance driven by the output pad 106. A larger characteristic impedance causes a signal on the output pad 106 to transition more slowly thereby reducing the frequency of the ring oscillator circuit 112. A combination of minimal resistance and minimal capacitance for the circuit trace 130 between the output connection point 120 and the input connection point 110 represents the highest oscillating frequency of the ring oscillator circuit 112.

Figure 2:
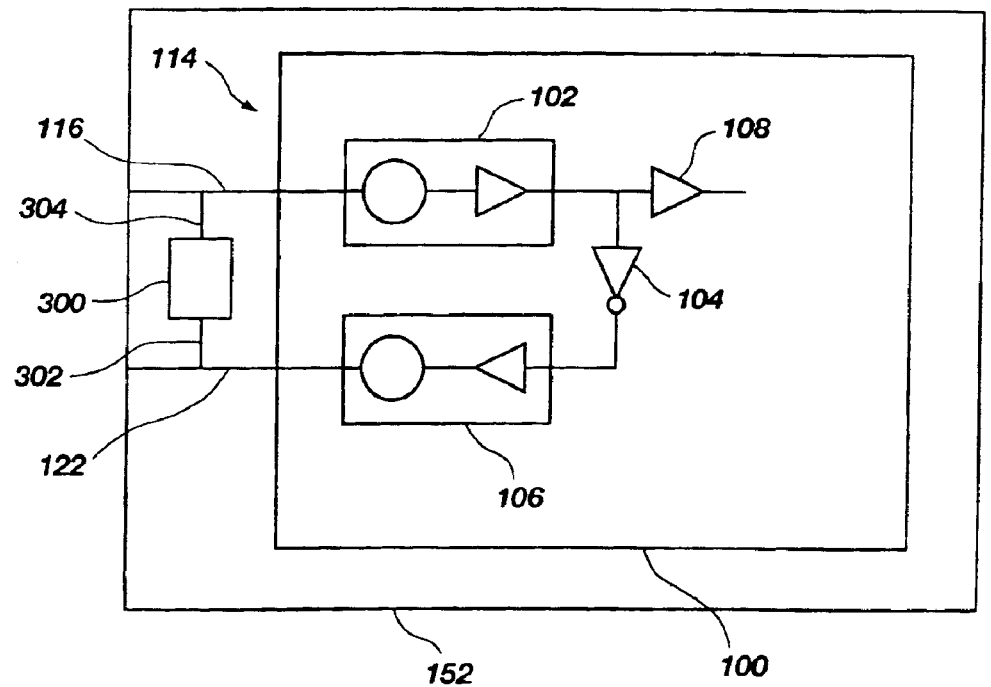
FIG. 2 is a block diagram showing the semiconductor device with input/output pads mounted on a package, and an optional delay element.

Another exemplary embodiment of the present invention, shown in FIG. 2, includes a ring oscillator circuit 114 which includes similar circuitry on the semiconductor device 100, with an additional delay element 300 physically attached to a semiconductor device package 152. An input terminal 302 of the delay element 300 connects to an output connection point 122 of the semiconductor device 100. The output terminal 304 of the delay element 300 connects to an input connection point 116 of the semiconductor device 100. The delay element is more fully described below.

Figure 3:
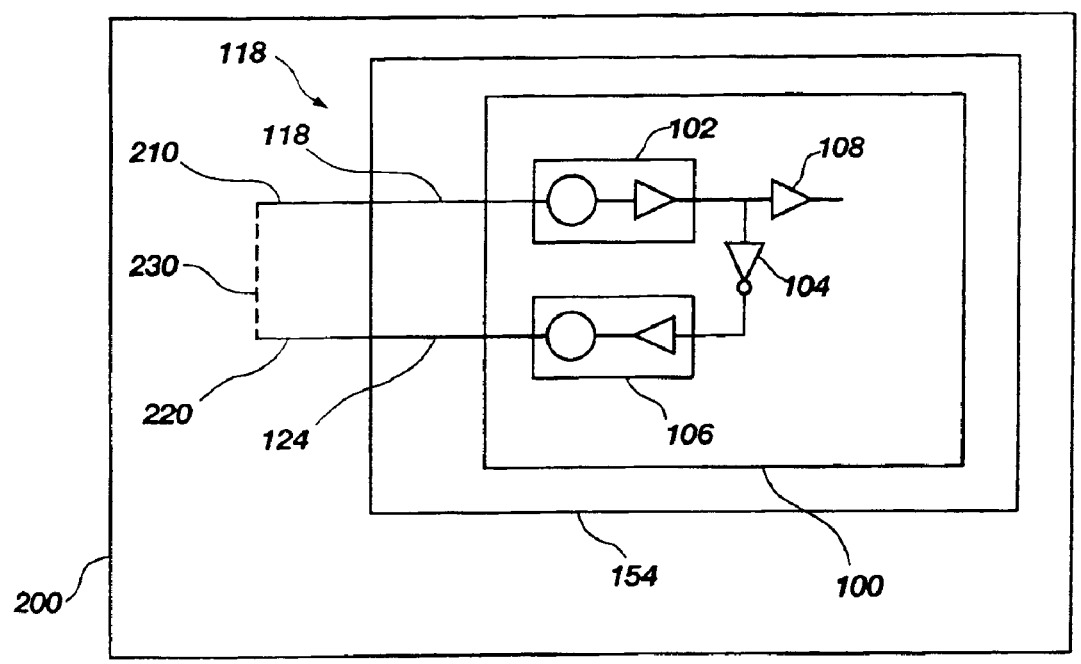
FIG. 3 is a block diagram showing a semiconductor device mounted on a package, with the package further mounted on a circuit board.

FIG. 3 illustrates a circuit board implementation, in accordance with another embodiment of the present invention. A circuit board 200 includes a semiconductor device package 154, further including semiconductor device 100. In this embodiment, the output pad 106 connects to an output connection point 124 on the semiconductor device package 154, which connects to an output connection trace 220 on the circuit board 200. Similarly, the input pad 102 connects to an input connection point 118 on the semiconductor device package 154, which connects to an input connection trace 210 on the circuit board 200. To close ring oscillator circuit 126, the input connection trace 210 connects with output connection trace 220 via a circuit trace 230. Coupling input connection trace 210 with output connection trace 220 creates a high operating frequency for the ring oscillator circuit 126 when closed on the circuit board 200. Due to the increased characteristic impedance of circuit board traces, this frequency typically will be slightly lower than the frequency possible with a connection on the semiconductor device package 150 as shown in FIG. 1. In addition, the frequency at which ring oscillator circuits may be tuned varies according to the length and width of the circuit trace 230, which causes the characteristic impedance driven by the output pad 106 to vary.

Figure 4:
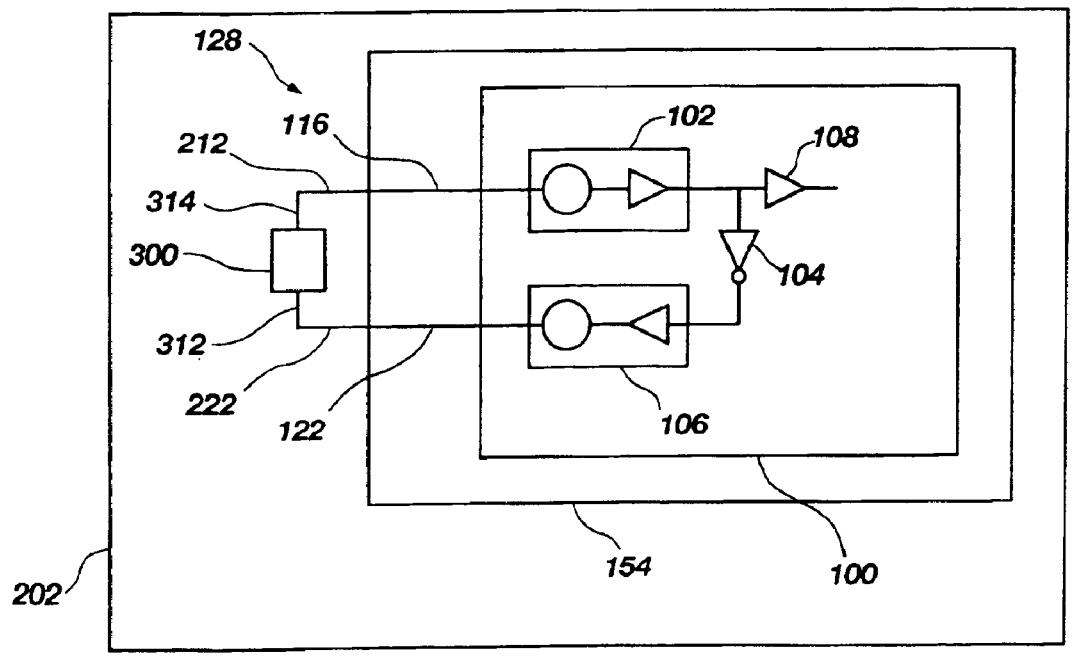
FIG. 4 is a block diagram showing a semiconductor device mounted on a package, the package further mounted on a circuit board, and an optional delay element.

FIG. 4 illustrates a circuit board implementation of a ring oscillator circuit 128, in accordance with yet another embodiment of the present invention. In FIG. 4, a delay element 300 is connected on a circuit board 202 by an input terminal 312 of the delay element 300 connecting to an output connection trace 222 on the circuit board 202. An output terminal 314 of the delay element 300 connects to an input connection trace 212 on the circuit board 202.

The delay element may be configured in many optional ways, and implemented in many physical locations, creating a predetermined time delay between the input terminal 312 and the output terminal 314. Some exemplary delay elements 300 are shown in FIG. 5, FIG. 6, and FIG. 7.

Figure 5:
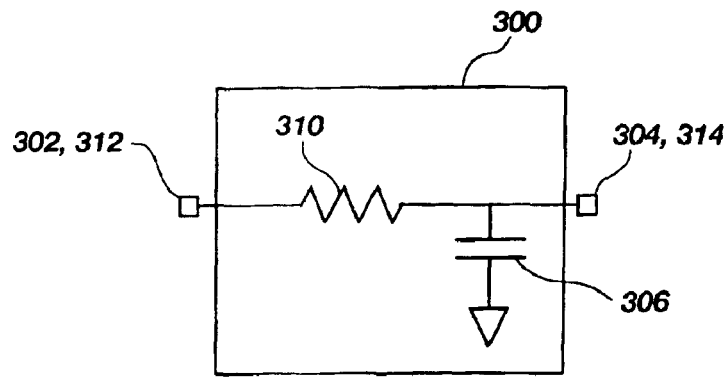
FIG. 5 is an exemplary implementation of a delay circuit comprised of passive electrical elements.

FIG. 5 illustrates a delay element 300 using passive electrical elements, in accordance with an embodiment of the present invention. In the present embodiment, a resistor 310 connects in series between an input terminal 302, 312 and an output terminal 304, 314. In addition, a capacitor 306 connects between ground and the output terminal 304, 314. This configuration is an example of many possible configurations of passive elements connected in a manner that will cause the output terminal to transition at a slower rate or delayed in time relative to the input terminal. Different amounts of delay, resulting in different oscillating frequencies, are possible and within the scope of the present invention, using the series resistor 310, the parallel capacitor 306, or additional passive elements (not shown).

Figure 6:
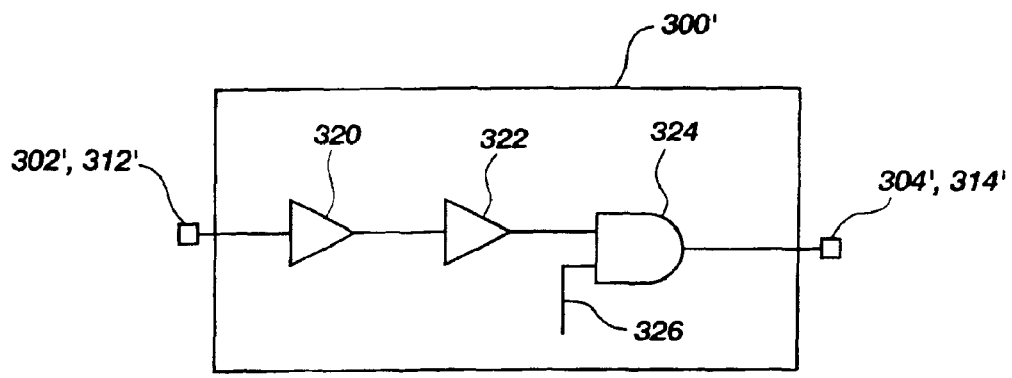
FIG. 6 is an exemplary implementation of a delay circuit comprised of active electrical elements.
Figure 7:
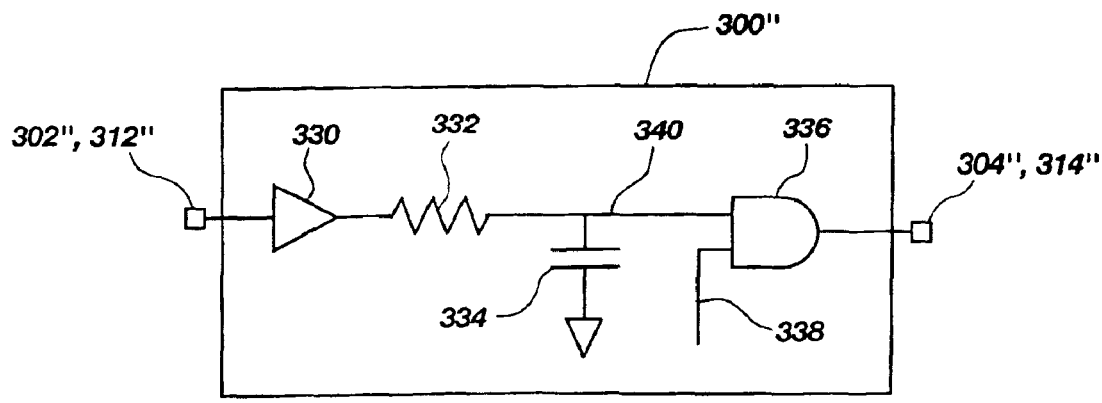
FIG. 7 is an exemplary implementation of a delay circuit comprised of passive electrical elements and active electrical elements.

FIG. 6 illustrates an embodiment of the delay element 300' using active electrical elements. In this exemplary embodiment, a non-inverting buffer 320, an additional non-inverting buffer 322, and an AND gate 324 connect in series between the input terminal 302', 312' and the output terminal 304', 314'. An additional enabling signal 326 connects to the second input terminal of the AND gate 324. The enabling signal 326 allows the ring oscillator circuit to oscillate when the enabling signal 326 is high, and prevents the ring oscillator circuit from oscillating when the enabling signal 326 is low.

The depicted configuration is one example, and many possible configurations of active elements connected in a manner that cause the output terminal to be delayed in time relative to the input terminal are possible. A different amount of delay, and as a result a different oscillating frequency, is possible by using a single non-inverting buffer 320, using the AND gate 324, or using a larger number of logic gates in the chain which are considered within the scope of the present invention. Many different logic gates may be used to create a long delay chain, including the input pad 102, the output pad 104, and the inverting circuit 104 on the semiconductor device 100, as long as the sum of elements contains an odd number of logic inversions. Additionally, delay lines are available that create fixed delays between the input and multiple delay taps on the output. Connecting a delay line (not shown) with a multiplexer (not shown) connected to the multiple delay taps, results in a method for creating precise delays, and a resulting precise frequency.

FIG. 7 illustrates an embodiment of the delay element 300" using a combination of active electrical elements and passive electrical elements. In this exemplary embodiment, a non-inverting buffer 330 connects to the input terminal 302", 312". To create a delay on the intermediate node 340, a series resistor 332 followed by a parallel capacitor 334 connects to the output terminal of the non-inverting buffer 330. In addition, an AND gate 336 connects between the intermediate node 340 and the output terminal 304", 314". An additional enabling signal 338 connects to the second input terminal of the AND gate 336. The enabling signal 338 allows the ring oscillator circuit to oscillate when the enabling signal 338 is high, and prevents the ring oscillator circuit from oscillating when the enabling signal 338 is low. The output of the AND gate connects to the output terminal 304", 314" of the delay element 300". As with the embodiment in FIG. 6, the integration of many combinations of passive devices, active devices, complex logic gates, and delay lines is also contemplated.

Additionally, the delay element 300, or various pieces of the delay element 300, may actually be configured in many physical locations. Portions of the delay element 300 may be on the semiconductor device package 150–154 and wired together by circuit traces on the semiconductor device package 150–154 as shown in FIGS. 2–4. Portions of the delay element 300 may be on the circuit board 202 and wired together by circuit traces on the circuit board as shown in FIG. 4. In addition, portions of the delay element may be on the semiconductor device and wired together through input/output (IO) pads and bonding elements connecting the IO pads to the semiconductor device package 150–154, and the circuit board 200–202.

Additionally, the portion of the ring oscillator circuit located on the semiconductor device 100 may contain the odd number of logic inversions, which enables the ring oscillator circuit to operate. Such an approach results in a very high oscillation frequency by connecting the output pad 106 to the input pad 102 on the semiconductor device package 150–154. However, it is also contemplated within the scope of the present invention that an odd number of logic inversions may be implemented in the delay element 300, rather the semiconductor device 100.

Specific embodiments have been shown by way of example in the drawings and have been described in detail herein, however the invention may be susceptible to additional various modifications and alternative forms. It should be understood that the invention is not intended to be limited to the particular forms disclosed. Rather, the invention includes all modifications, equivalents, and alternatives falling within the spirit and scope of the invention as defined by the following appended claims.

What is claimed is:

1. A ring oscillator for generating a signal, comprising:
   a semiconductor device package;
   a semiconductor device used as an evaluation test chip physically attached to the semiconductor device package comprising;
      an input pad circuit having an input signal and an output signal;
      a buffering circuit having an input signal and an output signal, wherein the input signal of the buffering circuit is connected to the output signal of the input pad circuit; and
      an output pad circuit having an input signal and an output signal, wherein the input signal of the output pad circuit is connected to the output signal of the buffering circuit;
   a delay circuit having an input terminal operably coupled to the output signal of the output pad circuit and an output terminal operably coupled to the input signal of the input pad circuit, wherein the delay circuit alters the signal arrival time at the input signal of the input pad thereby modifying the frequency of the ring oscillator; and wherein
   the combination of all circuit elements in the ring oscillator creates an odd number of logic inversions.

2. The ring oscillator of claim 1, wherein the delay circuit comprises a circuit trace connection on the semiconductor device package of a predetermined length between the input terminal and the output terminal.

3. The ring oscillator of claim 1, wherein the delay circuit comprises at least one passive electrical element operably connected in a manner creating a predetermined time delay between the input terminal and the output terminal.

4. The ring oscillator of claim 1, wherein the delay circuit comprises:
   at least one active electrical element operably connected in a manner creating a predetermined time delay between the input terminal and the output terminal; and
   an enabling circuit operably coupled as part of the ring oscillator controlling activation of the ring oscillator.

5. The ring oscillator of claim 1, wherein the delay circuit comprises:
   at least one passive electrical element and at least one active electrical element operably connected in a manner creating a predetermined time delay between the input terminal and the output terminal; and
   an enabling circuit operably coupled as part of the ring oscillator controlling activation of the ring oscillator.

6. A ring oscillator for generating a clock signal, comprising:
   a circuit board;
   a semiconductor device package physically attached to the circuit board;
   a semiconductor device used as an evaluation test chip physically attached to the semiconductor device package comprising;
      an input pad circuit having an input signal and an output signal;
      a buffering circuit having an input signal and an output signal, wherein the input signal of the buffering circuit is connected to the output signal of the input pad circuit; and
      an output pad circuit having an input signal and an output signal, wherein the input signal of the output pad circuit is connected to the output signal of the buffering circuit;
   a delay circuit, having an input terminal operably coupled to the output signal of the output pad circuit and an output terminal operably coupled to the input signal of the input pad circuit, wherein the delay circuit alters the signal arrival time at the input signal of the input pad thereby modifying the frequency of the ring oscillator; and wherein
   the combination of all circuit elements in the ring oscillator creates an odd number of logic inversions.

7. The ring oscillator of claim 6, wherein the delay circuit comprises a circuit trace connection on the circuit board of a predetermined length between the input terminal and the output terminal.

8. The ring oscillator of claim 6, wherein the delay circuit comprises at least one passive electrical element operably connected in a manner creating a predetermined time delay between the input terminal and the output terminal.

9. The ring oscillator of claim 6, wherein the delay circuit comprises:
    at least one active electrical element operably connected in a manner creating a predetermined time delay between the input terminal and the output terminal; and
    an enabling circuit operably coupled as part of the ring oscillator controlling activation of the ring oscillator.

10. The ring oscillator of claim 6, wherein the delay circuit comprises:
    at least one passive electrical element and at least one active electrical element operably connected in a manner creating a predetermined time delay between the input terminal and the output terminal; and
    an enabling circuit operably coupled as part of the ring oscillator controlling activation of the ring oscillator.

11. A method for modifying a frequency of an oscillating signal comprising:
    generating an oscillating signal of a predetermined frequency on a semiconductor device used as an evaluation test chip, wherein a predetermined number of circuit elements on the semiconductor device are connected in a ring oscillator configuration; and
    modifying the predetermined frequency of the oscillating signal by operably coupling a delay element in the ring oscillator configuration, wherein the operable coupling occurs on a semiconductor device package containing the semiconductor device.

12. The method of claim 11, wherein the step of modifying the predetermined frequency comprises, modifying a time delay of the delay element by combining at least one circuit element selected from the group consisting of, circuit traces, passive electrical elements, and active electrical elements.

13. The method of claim 11 further comprising, enabling operation of the oscillating signal in response to a control signal.

14. The method of claim 13, wherein the step of modifying the predetermined frequency comprises, modifying a time delay of the delay element by combining at least one circuit element selected from the group consisting of, circuit traces, passive electrical elements, and active electrical elements.

15. A method for modifying a frequency of an oscillating signal comprising:
    generating an oscillating signal of a predetermined frequency on a semiconductor device used as an evaluation test chip, wherein a predetermined number of circuit elements on the semiconductor device are connected in a ring oscillator configuration; and
    modifying the predetermined frequency of the oscillating signal by operably coupling a delay element in the ring oscillator configuration, wherein the operable coupling occurs on a circuit board containing the semiconductor device.

16. The method of claim 15, wherein the step of modifying the predetermined frequency comprises, modifying a time delay of the delay element by combining at least one circuit element selected from the group consisting of, circuit traces, passive electrical elements, and active electrical elements.

17. The method of claim 15 further comprising, enabling operation of the oscillating signal in response to a control signal.

18. The method of claim 17, wherein the step of modifying the predetermined frequency comprises, modifying a time delay of the delay element by combining at least one circuit element selected from the group consisting of, circuit traces, passive electrical elements, and active electrical elements.

19. A ring oscillator for generating a signal, comprising:
    a means for generating an oscillating signal of a predetermined frequency on a semiconductor device used as an evaluation test chip, wherein a predetermined number of circuit elements on the semiconductor device are connected in a ring oscillator configuration; and
    a means for modifying the predetermined frequency of the oscillating signal by operably coupling a delay element in the ring oscillator configuration, wherein the operable coupling occurs on a semiconductor device package containing the semiconductor device.

20. A ring oscillator for generating a signal, comprising:
    a means for generating an oscillating signal of a predetermined frequency on a semiconductor device used as an evaluation test chip, wherein a predetermined number of circuit elements on the semiconductor device are connected in a ring oscillator configuration; and
    a means for modifying the predetermined frequency of the oscillating signal by operably coupling a delay element in the ring oscillator configuration, wherein the operable coupling occurs on a circuit board containing the semiconductor device.

* * * * *